(12) United States Patent
Sano et al.

(10) Patent No.: US 8,524,847 B2
(45) Date of Patent: Sep. 3, 2013

(54) ORGANIC INSULATING MATERIAL, VARNISH FOR RESIN FILM USING THE SAME, RESIN FILM AND SEMICONDUCTOR DEVICE

(75) Inventors: Yohko Sano, Tokyo (JP); Mihoko Matsutani, Tokyo (JP); Kazuyoshi Fujita, Tokyo (JP)

(73) Assignee: Sumitomo Bakelite Co., Ltd., Tokyo (JP)

( * ) Notice: Subject to any disclaimer, the term of this patent is extended or adjusted under 35 U.S.C. 154(b) by 5 days.

(21) Appl. No.: 13/050,943

(22) Filed: Mar. 18, 2011

(65) Prior Publication Data
US 2011/0172351 A1 Jul. 14, 2011

Related U.S. Application Data

(63) Continuation of application No. 12/557,530, filed on Sep. 11, 2009, now abandoned, which is a continuation of application No. PCT/JP2008/054690, filed on Mar. 7, 2008.

(30) Foreign Application Priority Data

Mar. 20, 2007 (JP) .................. 2007-073129
Sep. 26, 2007 (JP) .................. 2007-250230

(51) Int. Cl.
*C08L 55/00* (2006.01)
*C08F 38/02* (2006.01)
*C08F 36/02* (2006.01)

(52) U.S. Cl.
USPC ........... 526/282; 524/553; 524/554; 438/125; 427/508; 522/2; 522/150; 522/157; 522/158; 522/159

(58) Field of Classification Search
USPC .............. 524/553, 554; 526/282; 438/125; 427/508; 522/2, 150, 157, 158, 159
See application file for complete search history.

(56) References Cited

U.S. PATENT DOCUMENTS

| 4,026,939 A * | 5/1977 | Weiss et al. ............ 554/106 |
| 2001/0026027 A1 * | 10/2001 | Nesbitt ............... 264/40.1 |
| 2004/0127715 A1 | 7/2004 | Kunimi et al. |

(Continued)

FOREIGN PATENT DOCUMENTS

| EP | 1752476 | 2/2007 |
| JP | 2001-332543 | 11/2001 |

(Continued)

OTHER PUBLICATIONS

Malik et al. Journal of Polymer Science Part A: Polymer Chemistry, 1992, 30, 1747.*

(Continued)

*Primary Examiner* — Mark Kaucher
(74) *Attorney, Agent, or Firm* — Ditthavong Mori & Steiner, P.C.

(57) ABSTRACT

An organic insulating material includes a prepolymer of a cage structure compound having a polymerizable unsaturated bond-containing group and a cage structure with an adamantane structure as the minimal unit. The prepolymer has a number-average molecular weight of between 2,000 and 500,000 based on polystyrene and measured by gel permeation chromatography. The prepolymer includes unsaturated bonds produced by reaction between the polymerizable unsaturated bonds and the unreacted polymerizable unsaturated bonds. The prepolymer has a residue rate of unreacted polymerizable unsaturated bonds of between 20% and 80%.

6 Claims, 1 Drawing Sheet

(56) References Cited

U.S. PATENT DOCUMENTS

| | | | |
|---|---|---|---|
| 2005/0090596 A1 | 4/2005 | Apen et al. | |
| 2005/0276964 A1* | 12/2005 | Watanabe et al. | 428/304.4 |
| 2005/0277751 A1 | 12/2005 | Satoh et al. | |
| 2007/0037941 A1 | 2/2007 | Watanabe | |
| 2007/0255003 A1 | 11/2007 | Watanabe et al. | |
| 2012/0220749 A1* | 8/2012 | Dasgupta | 528/226 |

FOREIGN PATENT DOCUMENTS

| | | |
|---|---|---|
| JP | 2004-204008 | 7/2004 |
| JP | 2005-041938 | 2/2005 |
| JP | 2005-522528 | 7/2005 |
| JP | 2005-343985 | 12/2005 |
| JP | 2006-241239 | 9/2006 |
| JP | 2006-249255 | 9/2006 |
| JP | 2006-257212 | 9/2006 |
| JP | 2007-031480 | 2/2007 |

OTHER PUBLICATIONS

Extended European Search Report for corresponding EP Application No. 08722087.7-2109, Nov. 19, 2010.

* cited by examiner

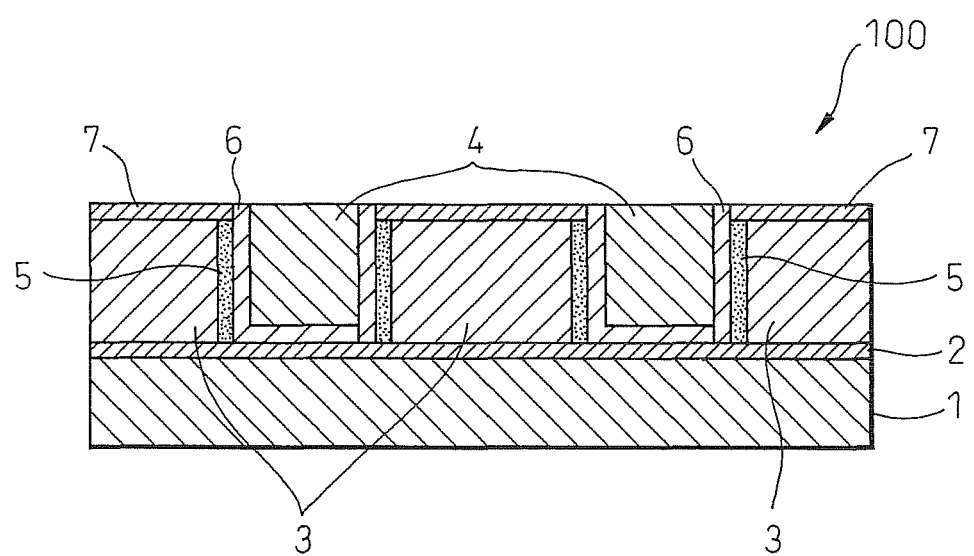

ORGANIC INSULATING MATERIAL, VARNISH FOR RESIN FILM USING THE SAME, RESIN FILM AND SEMICONDUCTOR DEVICE

CROSS-REFERENCE TO RELATED APPLICATIONS

This application is a continuation application of the U.S. patent application Ser. No. 12/557,530 filed Sep. 11, 2009, which in turn is a continuation application of International application No. PCT/JP2008/054690, having an international filing date of Mar. 7, 2008, which claims priority to Japanese Patent Application No. 2007-073129, filed Mar. 20, 2007, and Japanese Patent Application No. 2007-250230, filed Sep. 26, 2007, the entire contents of each of which are hereby incorporated by reference.

TECHNICAL FIELD

The present invention relates to an organic insulating material, to a varnish for resin film using the same, to a resin film and to a semiconductor device.

BACKGROUND ART

With increasing high integration, high speed and high performance of semiconductor devices in the field of electronic materials in recent years, the delay times caused by greater interconnect resistance and greater electric capacity of semiconductor integrated circuits are becoming more serious problems. In order to mitigate the delay times and increase semiconductor device speeds, it has become necessary to use low-permittivity insulating films in circuits.

Various attempts have been made to create porosity in materials in order to achieve even lower permittivity for insulating films. The methods for creating porosity include a method in which thermal decomposing components (porogens) are mixed or bonded therewith, and the porogens are decomposed during the heated firing step for formation of the insulating film, to form pores in the insulating film. However, the sizes of the pores present in films that are rendered porous by such methods are relatively large, being between several nanometers and several tens of nanometers, and because the pores are not independent but interconnected, the strength of the material is necessarily reduced, while several problems also arise as a result of the pores during the semiconductor process. Although introduction of processes such as pore sealing has been studied as a way of solving these problems, this can potentially increase the number of steps and the cost for production.

For example, as disclosed in Japanese Unexamined Patent Publication No. 2001-332543, materials are known that have numerous pores on the molecular level inside a resin structure. According to this prior art, pores are formed on the molecular level by bonding between a first crosslinking component and second crosslinking component, thus lowering the permittivity. However, such materials have been extremely difficult to manage, because they tend to undergo gelling during synthesis of the resins, and the solubility of the polymers during synthesis and their storage life as varnishes are poor.

Materials comprising compounds with —C≡CH bonds in the molecule are disclosed in Japanese Unexamined Patent Publication No. 2005-41938, for example. Because such materials require increased crosslink density in order to obtain sufficient mechanical strength, —C≡H groups are left in the molecule at above a fixed proportion. However, resin films composed of such materials have not exhibited satisfactory permittivity.

DISCLOSURE OF THE INVENTION

In light of these circumstances, it is an object of the present invention to provide useful organic insulating materials exhibiting low permittivity, high heat resistance and high mechanical strength, as well as to provide semiconductor devices employing them.

Specifically, the invention comprises the following aspects (1) to (11).

(1) An organic insulating material comprising a prepolymer of a cage-structure compound having a polymerizable unsaturated bond-containing group and a cage structure with an adamantane structure as the minimal unit, wherein the prepolymer has a number-average molecular weight of between 2,000 and 500,000 based on polystyrene and measured by gel permeation chromatography.
(2) An organic insulating material according to (1), wherein the cage structure with an adamantane structure as the minimal unit is an adamantane structure, polyamantane structure, poly(polyamantane) structure or polyadamantane structure.
(3) An organic insulating material according to (1) or (2), wherein the prepolymer comprises unsaturated bonds produced by reaction between the polymerizable unsaturated bonds in the cage structure compound, or unsaturated bonds produced by reaction between the polymerizable unsaturated bonds, and the unreacted polymerizable unsaturated bonds.
(4) An organic insulating material according to (3), wherein the prepolymer has a residue rate of unreacted polymerizable unsaturated bonds of between 20% and 80%.
(5) An organic insulating material according to any one of (1) to (4), wherein the cage structure compound is a compound represented by the following formula (1).

(In formula (1), X and Y represent one or more groups each comprising the same or different polymerizable unsaturated bonds. W and Z each represent a group having an adamantane or polyamantane structure, and they may be the same or different. The symbol n represents an integer of 0 or greater.)
(6) An organic insulating material according to any one of (1) to (5), wherein the cage structure compound is a compound represented by the following formula (2).

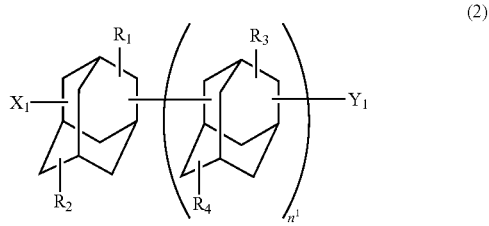

(wherein $X_1$ and $Y_1$ each represent one or more groups containing polymerizable unsaturated bonds, and they may be the same or different from each other. $R_1$-$R_4$ each independently represent hydrogen or an organic group, and they may be the same or different from each other. The symbol $n^1$ represents an integer of 0 or greater.)

(7) An organic insulating material according to any one of (1) to (6), wherein the polymerizable unsaturated bond is a carbon-carbon triple bond.

(8) An organic insulating material according to any one of (1) to (7), wherein at least one of the polymerizable unsaturated bond-containing groups is a group represented by formula (3) or a group represented by formula (4).

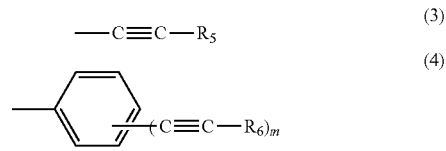

(In the formula, $R_5$ and $R_6$ each independently represent hydrogen or an organic group. The symbol m is an integer of 1-5.)

(9) A varnish for resin film comprising an organic insulating material according to any one of (1) to (8), and an organic solvent.

(10) A resin film obtained by using an organic insulating material according to any one of (1) to (8) or a varnish for resin film according to (9), for crosslinking reaction by heating, active energy beam irradiation, or heating and active energy beam irradiation.

(11) A semiconductor device provided with a resin film according to (10).

BRIEF DESCRIPTION OF THE DRAWINGS

FIG. 1 is a schematic cross-sectional view showing an example of a semiconductor device according to the invention.

BEST MODE FOR CARRYING OUT THE INVENTION

The present invention provides organic insulating materials which comprise a prepolymer of a cage structure compound having a polymerizable unsaturated bond-containing group and a cage structure with an adamantane structure as the minimal unit, wherein the prepolymer has a number-average molecular weight of between 2,000 and 500,000 based on polystyrene and measured by gel permeation chromatography (hereinafter also abbreviated as "GPC"). It is thereby possible to obtain resin films with excellent heat resistance, mechanical properties and electrical characteristics.

A varnish for resin film according to the invention comprises the aforementioned organic insulating material.

A resin film according to the invention is obtained by using the aforementioned organic insulating material or varnish for resin film, and specifically it is obtained by crosslinking reaction using a prepolymer produced by polymerizing a cage structure compound having the polymerizable unsaturated bond-containing group of the aforementioned organic insulating material, and a cage structure with an adamantane structure as the minimal unit, thus producing a resin film with excellent heat resistance, mechanical properties and electrical characteristics.

A semiconductor device according to the invention is provided with the aforementioned resin film.

The organic insulating material of the invention will be explained first.

The organic insulating material of the invention comprises a prepolymer obtained by reacting all or a portion of the polymerizable unsaturated bonds in the aforementioned cage structure compound. The prepolymer has an unsaturated bond newly produced by reacting all or a portion of the unsaturated bonds, as the reactive portions of the polymerizable unsaturated bonds.

According to the invention, the prepolymer of the cage structure compound may be an oligomer or a polymer, and the number-average molecular weight based on polystyrene as measured by GPC is between 2,000 and 500,000 and more preferably between 5,000 and 200,000. If the number-average molecular weight is less than 2,000, appearance defects may be produced in the coated film due to precipitates and the like during formation of the coated film of the prepolymer. On the other hand, a number-average molecular weight of greater than 500,000 can result in insolubilization of the prepolymer in organic solvents.

Without being restricted to any particular theory, it is believed that the prepolymer of the cage structure compound according to the invention having a number-average molecular weight of at least 2,000 forms a branched structure centered around the cage structure, thus inhibiting molecular aggregation of the prepolymers. Consequently, when a coated film is formed from a varnish for resin film obtained by dissolving the prepolymer of the invention in an organic solvent, a molecular pore structure with pore sizes of about 1-3 nm is formed within the prepolymer during drying of the coated film. When the prepolymer has been crosslinked to obtain a resin film by curing of the dried coated film, a branched crosslinked structure is formed centered around the cage structure while maintaining the molecular pore structure. Consequently, the resin film obtained by crosslinking a prepolymer of the invention has lower density than a resin film obtained by crosslinked a prepolymer with a number-average molecular weight of less than 2,000, due to greater formation of a molecular pore structure with a pore size of about 1-3 nm inside the resin film. As a result, it is possible to achieve lower permittivity in the obtained resin film. The molecular pore size can be determined as the equivalent sphere diameter by positron annihilation life measurement.

The prepolymer of the cage structure compound may be an oligomer as mentioned above, but the molecular pore structure can be increased by removing the low molecular weight substances based on differences in solubility, or by separating the high molecular weight substances by fractionation or the like, to increase the proportion of high molecular weight substances in the prepolymer. The increased molecular pore structure can lower the permittivity. However, as mentioned above, an excessively high molecular weight of the prepolymer may result in insolubility in solvents.

As polymerizable unsaturated bond-containing groups, in the cage structure compound having a polymerizable unsaturated bond-containing group and a cage structure with an adamantane structure as the minimal unit, there may be mentioned acetylene bond (carbon-carbon triple bond)-containing groups, vinyl bond (carbon-carbon double bond)-containing groups, and cyano groups. Preferred among these are carbon-carbon triple bond-containing groups. As carbon-carbon triple bond-containing groups there may be mentioned carbon-carbon triple bonds, as well as groups containing straight-chain aliphatic groups such as methyl and ethyl, cyclic aliphatic groups such as cyclohexyl and adamantyl, and aromatic groups such as phenyl, naphthyl and fluorenyl.

As carbon-carbon triple bond-containing groups there are preferred groups represented by formula (3) and groups represented by formula (4), as well as those with more than one of the foregoing.

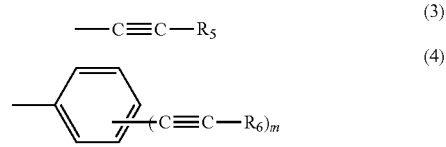

(In the formula, $R_5$ and $R_6$ each independently represent hydrogen or an organic group. The symbol m is an integer of 1-5.)

As organic groups there may be mentioned straight-chain aliphatic groups such as methyl, ethyl, propyl and butyl, cyclic aliphatic groups such as cyclohexyl and adamantyl, and aromatic groups such as phenyl, naphthyl and fluorenyl.

A specific example of a carbon-carbon triple bond-containing group is a group represented by formula (3) above wherein $R_5$ is hydrogen, i.e. ethynyl. When $R_5$ is an organic group, there may be mentioned methylethynyl, ethylethynyl, propylethynyl and butylethynyl where a straight-chain aliphatic group is the organic group, adamantylethynyl, cycloheptylethynyl and cyclohexylethynyl where a cyclic aliphatic group is the organic group, and phenylethynyl, phenoxyphenylethynyl, naphthylethynyl and fluorenylethynyl where an aromatic group is the organic group.

As groups represented by formula (4), when $R_6$ is hydrogen, there may be mentioned 2-ethynylphenyl, 3-ethynylphenyl, 4-ethynylphenyl, 2,3-diethynylphenyl, 2,4-diethynylphenyl, 2,5-diethynylphenyl, 2,6-diethynylphenyl, 3,4-diethynylphenyl, 3,5-diethynylphenyl, 2,3,4-triethynylphenyl, 2,3,5-triethynylphenyl, 2,3,6-triethynylphenyl, 2,4,5-triethynylphenyl, 2,4,6-triethynylphenyl, 3,4,5-triethynylphenyl, 2,3,4,5-tetraethynylphenyl, 2,3,4,6-tetraethynylphenyl, 2,3,5,6-tetraethynylphenyl and 2,3,4,5,6-pentaethynylphenyl, when $R_6$ is an organic group, 2-methylethynylphenyl, 3-methylethynylphenyl, 4-methylethynylphenyl, 2,3-bis(methylethynyl)phenyl, 2,4-bis(methylethynyl)phenyl, 2,5-bis(methylethynyl)phenyl, 2,6-bis(methylethynyl)phenyl, 3,4-bis(methylethynyl)phenyl, 3,5-bis(methylethynyl)phenyl, 2,3,4-tris(methylethynyl)phenyl, 2,3,5-tris(methylethynyl)phenyl, 2,3,6-tris(methylethynyl)phenyl, 2,4,5-tris(methylethynyl)phenyl, 2,4,6-tris(methylethynyl)phenyl, 3,4,5-tris(methylethynyl)phenyl, 2,3,4,5-tetrakis(methylethynyl)phenyl, 2,3,4,6-tetrakis(methylethynyl)phenyl, 2,3,5,6-tetrakis(methylethynyl)phenyl and 2,3,4,5,6-pentakis(methylethynyl)phenyl where a straight-chain aliphatic group is the organic group, 2-(1-adamantylethynyl)phenyl, 3-(1-adamantylethynyl)phenyl, 4-(1-adamantylethynyl)phenyl, 2,3-bis(1-adamantylethynyl)phenyl, 2,4-bis(1-adamantylethynyl)phenyl, 2,5-bis(1-adamantylethynyl)phenyl, 2,6-bis(1-adamantylethynyl)phenyl, 3,4-bis(1-adamantylethynyl)phenyl, 3,5-bis(1-adamantylethynyl)phenyl, 2,3,4-tris(1-adamantylethynyl)phenyl, 2,3,5-tris(1-adamantylethynyl)phenyl, 2,3,6-tris(1-adamantylethynyl)phenyl, 2,4,5-tris(1-adamantylethynyl)phenyl, 2,4,6-tris(1-adamantylethynyl)phenyl, 3,4,5-tris(1-adamantylethynyl)phenyl, 2,3,4,5-tetrakis(1-adamantylethynyl)phenyl, 2,3,4,6-tetrakis(1-adamantylethynyl)phenyl, 2,3,5,6-tetrakis(1-adamantylethynyl)phenyl and 2,3,4,5,6-pentakis(1-adamantylethynyl)phenyl where a cyclic aliphatic group is the organic group, and 2-phenylethynylphenyl, 3-phenylethynylphenyl, 4-phenylethynylphenyl, 2,3-bis(phenylethynyl)phenyl, 2,4-bis(phenylethynyl)phenyl, 2,5-bis(phenylethynyl)phenyl, 2,6-bis(phenylethynyl)phenyl, 3,4-bis(phenylethynyl)phenyl, 3,5-bis(phenylethynyl)phenyl, 2,3,4-tris(phenylethynyl)phenyl, 2,3,5-tris(phenylethynyl)phenyl, 2,3,6-tris(phenylethynyl)phenyl, 2,4,5-tris(phenylethynyl)phenyl, 2,4,6-tris(phenylethynyl)phenyl, 3,4,5-tris(phenylethynyl)phenyl, 2,3,4,5-tetrakis(phenylethynyl)phenyl, 2,3,4,6-tetrakis(phenylethynyl)phenyl, 2,3,5,6-tetrakis(phenylethynyl)phenyl and 2,3,4,5,6-pentakis(phenylethynyl)phenyl where an aromatic group is the organic group.

Preferred among these are ethynyl, 4-ethynylphenyl, 3,5-diethynylphenyl, 3,4-diethynylphenyl, 4-methylethynylphenyl, 3,5-bis(methylethynyl)phenyl and 3,4-bis(methylethynyl)phenyl for superior solubility of the prepolymer in organic solvents and superior heat resistance of the resin film, although there is no restrictions to these. The hydrogens in the aforementioned acetylene bond-containing groups may be replaced by fluorine atoms, methyl, trifluoromethyl, phenyl or the like.

The cage structure in the cage structure compound having a group containing a polymerizable unsaturated bond group and a cage structure with an adamantane structure as the minimal unit, may be a polyadamantane structure having an adamantane structure, a polyamantane structure or plurality of adamantane structures linked together as the skeleton, or a poly(polyamantane) structure having a plurality of polyamantane structures linked together as the skeleton.

As such structures there may be mentioned compounds having the structure represented by formula (1).

(In formula (1), X and Y represent one or more groups each comprising the same or different polymerizable unsaturated bonds. W and Z each represent a group having an adamantane or polyamantane structure, and they may be the same or different. The symbol n represents an integer of 0 or greater.)

The compound having a structure represented by formula (1) above comprises a group with an adamantane or polyamantane structure as W and Z, but it may have both a group with an adamantane structure and with a polyamantane structure. Preferred for W and Z in formula (1) are polyadamantane compounds represented by the following formula (2) and poly(polyamantane) compounds represented by formula (6), for the adamantane or polyamantane structure, particularly from the viewpoint of obtaining low permittivity.

As compounds with a structure represented by formula (2) there may also be mentioned those having a structure represented by formula (5).

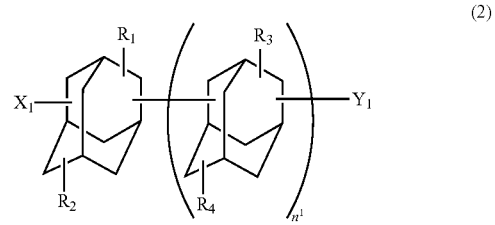

(In formula (2), $X_1$ and $Y_1$ each represent one or more groups containing polymerizable unsaturated bonds, which may be the same or different, and the aforementioned polymerizable unsaturated bond-containing groups may be mentioned as specific examples. $R_1$-$R_4$ each represent hydrogen or an organic group. The symbol $n^1$ is the same as n in formula (1) above.)

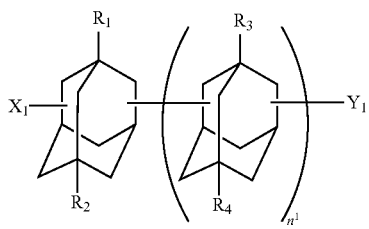

(5)

(In formula (5), $X_1$, $Y_1$ and $R_1$-$R_4$ have the same definitions as $X_1$, $Y_1$ and $R_1$-$R_4$ in formula (2). The symbol $n^1$ is the same as n in general formula (1) above.)

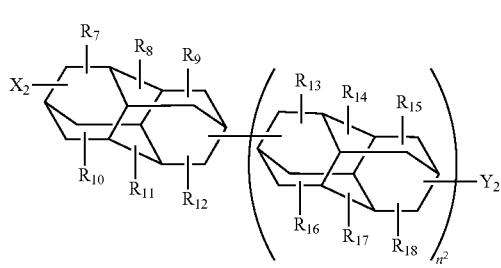

(6)

(In formula (6), $X_2$ and $Y_2$ each represent one or more groups containing polymerizable unsaturated bonds, which may be the same or different, and the aforementioned polymerizable unsaturated bond-containing groups may be mentioned as specific examples. $R_7$-$R_{18}$ each represent hydrogen or an organic group. The symbol $n^2$ is the same as n in general formula (1) above.)

The number of adamantane structures or polyamantane structures in the polyadamantane structure compounds and poly(polyamantane) structure compounds is represented by n in formula (1), the number n for the adamantane or polyamantane structures being 0 or greater, while the upper limit is not particularly restricted, but is preferably no greater than 4 (i.e., n is 3 or smaller) from the viewpoint of solubility in solvents when the polyadamantane structure or polyamantane structure compound is used as a polymer.

As polyamantane structures there may be mentioned diamantane rings, triamantane rings, tetraamantane rings, pentaamantane rings and hexaamantane rings.

As specific examples of adamantane skeletons having a plurality of adamantane structures linked together, there may be mentioned biadamantane skeletons such as 1,1'-biadamantane skeleton, 2,2'-biadamantane skeleton and 1,2'-biadamantane skeleton, triadamantane skeletons such as 1,1':3',1"-triadamantane skeleton, 1,2':5',1"-triadamantane skeleton, 1,2':4',1"-triadamantane skeleton and 2,2':4',2"-triadamantane skeleton, tetraadamantane skeletons such as 1,1':3',1": 3",1'"-tetraadamantane skeleton, 1,2':5',1":3",1'"-tetraadamantane skeleton, 1,2':4',1":3",1'"-tetraadamantane skeleton, 1,1':4',1":4",1'"-tetraadamantane skeleton and 1,1':3',1":3", 2'"-tetraadamantane skeleton, and pentaadamantane skeletons such as 1,1':3',1":3",1'":3'",1""-pentaadamantane skeleton, 1,1':4',1":3",1'":3'",1""-pentaadamantane skeleton, 1,1': 4',1":4",1'":3'",1""-pentaadamantane skeleton and 1,1':3',1": 4",2'":5'",1""-pentaadamantane skeleton. Of these, biadamantane compounds with biadamantane skeletons are preferred from the standpoint of solubility in solvents. As biadamantane skeletons there may be mentioned 1,1'-biadamantane skeleton, 2,2'-biadamantane skeleton and 1,2'-biadamantane skeleton, with 1,1'-biadamantane skeleton being preferred to obtain an organic insulating film with more excellent heat resistance, and compounds with structures represented by formula (2) being even more preferred.

As specific examples of poly(polyamantane) skeletons having a plurality of polyamantane structures linked together there may be mentioned skeletons having a plurality of diamantane structures linked together, such as bi(diamantane) skeleton, tri(diamantane) skeleton, tetra(diamantane) skeleton and penta(diamantane) skeleton, skeletons having a plurality of triamantane structures linked together such as bi(triamantane) skeleton, tri(triamantane) skeleton, tetra(triamantane) skeleton and penta(triamantane) skeleton, and skeletons having a plurality of tetraamantane structures linked together such as bi(tetraamantane) skeleton, tri(tetraamantane) skeleton, tetra(tetraamantane) skeleton and penta(tetraamantane) skeleton.

As specific examples of such compounds having a diamantane skeleton as the polyamantane structure, there may be mentioned bi(diamantane) skeletons such as 4,4'-bi(diamantane) skeleton, 3,3'-bi(diamantane) skeleton and 3,4'-bi(diamantane) skeleton, tri(diamantane) skeletons such as 4,4':9', 4"-tri(diamantane) skeleton, 4,3':9',4"-tri(diamantane) skeleton, 4,3':8',4"-tri(diamantane) skeleton and 3,3':8',3"-tri(diamantane) skeleton, and tetra(diamantane) skeletons such as 4,4':9',4":9",4'"-tetra(diamantane) skeleton, 4,3':9',4":9", 4'"-tetra(diamantane) skeleton, 4,4':8',4":8",4'"-tetra(diamantane) skeleton and 4,4':9',4":9",3'"-tetra(diamantane) skeleton. Of these, compounds with bi(diamantane) skeletons are preferred from the standpoint of solubility in solvents. More preferred are 4,4'-bi(diamantane) skeletons in order to obtain insulating films with more excellent heat resistance.

The hydrogens in the adamantane or polyamantane structure of the cage structure compound having the polymerizable unsaturated bond group and the cage structure with an adamantane structure as the minimal unit, may have C1-20 alkyl groups, and the alkyl groups may be methyl, ethyl, propyl, butyl, hexyl, heptyl, octyl or the like, among which methyl and ethyl groups are more preferred. By introducing alkyl groups into the adamantane or polyamantane structure, it is possible to improve the solubility in organic solvents and the heat resistance.

A polyadamantane structure compound and a poly(polyamantane) structure compound may have substituents that are the same or different for each adamantane or polyamantane structure bridgehead position. Specifically, $R_1$-$R_4$ in formula (2) are each independently hydrogen or an organic group, and they may be the same or different. When $n^1$ is an integer of 2 or greater, $R_3$ and $R_4$ may be the same or different in each adamantane structure. If a compound represented by formula (6) is used as an example of a poly(polyamantane) structure compound, $R_7$-$R_{18}$ are each independently hydrogen or an organic group, and may be the same or different. When $n^2$ is an integer of 2 or greater, $R_{13}$-$R_{18}$ may be the same or different in each polyamantane structure.

As organic groups for $R_1$-$R_4$ and $R_7$-$R_{18}$, there may be mentioned aliphatic groups and aromatic groups. As aliphatic groups there may be mentioned straight-chain aliphatic groups and cyclic aliphatic groups, as specific examples of straight-chain aliphatic groups there may be mentioned methyl, ethyl, propyl, butyl and hexyl, and as specific examples of cyclic aliphatic groups there may be mentioned cyclohexyl, bicyclo[2,2,1]heptyl and adamantyl. As aromatic groups there may be mentioned phenyl, naphthyl, anthracenyl, phenanthrenyl, polycyclic aromatic groups with 4 or more aromatic rings, fluorenyl, diphenylfluorenyl, biphenyl and the like, with no limitation to these.

If the straight-chain aliphatic groups are methyl or ethyl, for example, the solubility in organic solvents and heat resistance can be improved. The hydrogens in these organic groups may also be replaced by fluorine atoms, methyl, methoxy or trifluoromethyl groups. $R_1$-$R_4$ and $R_7$-$R_{18}$ may also be groups containing polymerizable unsaturated bond groups.

As specific examples of compounds with groups containing carbon-carbon triple bond groups represented by formula (3), among the compound structures represented by formula (1) as specific examples of cage structure compounds having a polymerizable unsaturated bond-containing group and a cage structure with an adamantane structure as the minimal unit, there may be mentioned, as compounds with hydrogen as $R_5$, 4,9-diethynyldiamantane, 2,4,7,9-tetraethynyldiamantane, 4,4'-diethynyl-9,9'-bi(diamantane), 3,3'-diethynyl-1,1'-biadamantane, 3,3',5,5'-tetramethyl-7,7'-diethynyl-1,1'-biadamantane, 3,5-diethynyl-1,1'-biadamantane, 3,5,3'-triethynyl-1,1'-biadamantane, 3,3',5,5'-tetraethynyl-1,1'-biadamantane, 3,3',5,7-tetraethynyl-1,1'-biadamantane, 3,3',5,5',7-pentaethynyl-1,1'-biadamantane, 3,3',5,5',7,7'-hexaethynyl-1,1'-biadamantane, 3,3',5,5'-tetraphenyl-7,7'-diethynyl-1,1'-biadamantane and the like, as compounds with methyl groups in the organic groups as $R_5$, 4,9-bis(methylethynyl)diamantane, 2,4,7,9-tetrakis(methylethynyl)diamantane, 4,4'-bis(methylethynyl)-9,9'-bi(diamantane), 3,3'-bis(methylethynyl)-1,1'-biadamantane, 3,3',5,5'-tetramethyl-7,7'-bis(methylethynyl)-1,1'-biadamantane, 3,5-bis(methylethynyl)-1,1'-biadamantane, 3,5,3'-tris(methylethynyl)-1,1'-biadamantane, 3,3',5,5'-tetrakis(methylethynyl)-1,1'-biadamantane, 3,3',5,7-tetrakis(methylethynyl)-1,1'-biadamantane, 3,3',5,5',7-pentakis(methylethynyl)-1,1'-biadamantane, 3,3',5,5',7,7'-hexakis(methylethynyl)-1,1'-biadamantane, 3,3',5,5'-tetraphenyl-7,7'-bis(methylethynyl)-1,1'-biadamantane and the like, and as compounds with phenyl groups in the organic groups as $R_5$, 4,9-bis(phenylethynyl)diamantane, 2,4,7,9-tetrakis(phenylethynyl)diamantane, 4,4'-bis(phenylethynyl)-9,9'-bi(diamantane), 3,3'-bis(phenylethynyl)-1,1'-biadamantane, 3,3',5,5'-tetramethyl-7,7'-bis(phenylethynyl)-1,1'-biadamantane, 3,5-bis(phenylethynyl)-1,1'-biadamantane, 3,5,3'-tris(phenylethynyl)-1,1'-biadamantane, 3,3',5,5'-tetrakis(phenylethynyl)-1,1'-biadamantane, 3,3',5,7-tetrakis(phenylethynyl)-1,1'-biadamantane, 3,3',5,5',7-pentakis(phenylethynyl)-1,1'-biadamantane, 3,3',5,5',7,7'-hexakis(phenylethynyl)-1,1'-biadamantane, 3,3',5,5'-tetraphenyl-7,7'-bis(phenylethynyl)-1,1'-biadamantane and the like, with no limitation to these. Preferred among these are 3,3',5,5'-tetramethyl-7,7'-diethynyl-1,1'-biadamantane, 3,3',5,5'-tetraethynyl-1,1'-biadamantane, 3,3',5,5'-tetramethyl-7,7'-bis(methylethynyl)-1,1'-biadamantane and 3,3',5,5'-tetramethyl-7,7'-bis(phenylethynyl)-1,1'-biadamantane, with 3,3',5,5'-tetramethyl-7,7'-diethynyl-1,1'-biadamantane, 3,3',5,5'-tetraethynyl-1,1'-biadamantane being particularly preferred from the viewpoint of solubility and heat resistance. Among the specific examples of cage structure compounds having a polymerizable unsaturated bond-containing group and a cage structure with an adamantane structure as the minimal unit, there may be mentioned those with diamantane compounds as the polyamantane structure, with no limitation to these. Also, biadamantane compounds were mentioned as polyadamantane structures, but they may also be other adamantane compounds or polyamantane compounds wherein n is 2 or greater in the compounds represented by general formula (1).

As specific examples of compounds with carbon-carbon triple bond group-containing groups represented by formula (4), of the compounds represented by formula (1) above, there may be mentioned compounds with hydrogen as $R_6$ such as 4,9-bis(3,5-diethynylphenyl)diamantane, 2,4,7,9-tetrakis(3,5-diethynylphenyl)diamantane, 4,4'-bis(3,5-diethynylphenyl)-9,9'-bi(diamantane), 3,3'-bis(3,5-diethynylphenyl)-1,1'-biadamantane, 3,3',5,5'-tetramethyl-7,7'-bis(3,5-diethynylphenyl)-1,1'-biadamantane, 3,5-bis(3,5-diethynylphenyl)-1,1'-biadamantane, 3,5,3'-tris(3,5-diethynylphenyl)-1,1'-biadamantane, 3,3',5,5'-tetrakis(3,5-diethynylphenyl)-1,1'-biadamantane, 3,3',5,7-tetrakis(3,5-diethynylphenyl)-1,1'-biadamantane, 3,3',5,5',7-pentakis(3,5-diethynylphenyl)-1,1'-biadamantane, 3,3',5,5',7,7'-hexakis(3,5-diethynylphenyl)-1,1'-biadamantane, 3,3',5,5'-tetraphenyl-7,7'-bis(3,5-diethynylphenyl)-1,1'-biadamantane, 3,3',5,5'-tetramethyl-7,7'-bis(4-ethynylphenyl)-1,1'-biadamantane, 3,3'-bis(3,4-diethynylphenyl)-1,1'-biadamantane and 3,3'-bis(2,3,5-triethynylphenyl)-1,1'-biadamantane; compounds with methyl groups as organic groups for $R_6$ such as 4,9-bis(3,5-dimethylethynylphenyl)diamantane, 2,4,7,9-tetrakis(3,5-dimethylethynylphenyl)diamantane, 4,4'-bis(3,5-dimethylethynylphenyl)-9,9'-bi(diamantane), 3,3'-bis(3,5-dimethylethynylphenyl)-1,1'-biadamantane, 3,3',5,5'-tetramethyl-7,7'-bis(3,5-dimethylethynylphenyl)-1,1'-biadamantane, 3,5-bis(3,5-dimethylethynylphenyl)-1,1'-biadamantane, 3,5,3'-tris(3,5-dimethylethynylphenyl)-1,1'-biadamantane, 3,3',5,5'-tetrakis(3,5-dimethylethynylphenyl)-1,1'-biadamantane, 3,3',5,7-tetrakis(3,5-dimethylethynylphenyl)-1,1'-biadamantane, 3,3',5,5',7-pentakis(3,5-dimethylethynylphenyl)-1,1'-biadamantane, 3,3',5,5',7,7'-hexakis(3,5-dimethylethynylphenyl)-1,1'-biadamantane, 3,3',5,5'-tetraphenyl-7,7'-bis(3,5-dimethylethynylphenyl)-1,1'-biadamantane, 3,3',5,5'-tetramethyl-7,7'-bis(4-methylethynylphenyl)-1,1'-biadamantane, 3,3'-bis(3,4-dimethylethynylphenyl)-1,1'-biadamantane and 3,3'-bis(2,3,5-trimethylethynylphenyl)-1,1'-biadamantane; and compounds with phenyl groups as organic groups for $R_6$, such as 4,9-bis(3,5-diphenylethynylphenyl)diamantane, 2,4,7,9-tetrakis(3,5-diphenylethynylphenyl)diamantane, 4,4'-bis(3,5-diphenylethynylphenyl)-9,9'-bi(diamantane), 3,3'-bis(3,5-diphenylethynylphenyl)-1,1'-biadamantane, 3,3',5,5'-tetramethyl-7,7'-bis(3,5-diphenylethynylphenyl)-1,1'-biadamantane, 3,5-bis(3,5-diphenylethynylphenyl)-1,1'-biadamantane, 3,5,3'-tris(3,5-diphenylethynylphenyl)-1,1'-biadamantane, 3,3',5,5'-tetrakis(3,5-diphenylethynylphenyl)-1,1'-biadamantane, 3,3',5,7-tetrakis(3,5-diphenylethynylphenyl)-1,1'-biadamantane, 3,3',5,5',7-pentakis(3,5-diphenylethynylphenyl)-1,1'-biadamantane, 3,3',5,5',7,7'-hexakis(3,5-diphenylethynylphenyl)-1,1'-biadamantane, 3,3',5,5'-tetraphenyl-7,7'-bis(3,5-diphenylethynylphenyl)-1,1'-biadamantane, 3,3'-bis(3,4-diphenylethynylphenyl)-1,1'-biadamantane and 3,3'-bis(2,3,5-triphenylethynylphenyl)-1,1'-biadamantane and the like, with no limitation to these. Preferred among these are 3,3',5,5'-tetramethyl-7,7'-bis(4-ethynylphenyl)-1,1'-biadamantane, 3,3'-bis(3,4-diethynylphenyl)-1,1'-biadamantane, 3,3',5,5'-tetramethyl-7,7'-bis(3,5-diethynylphenyl)-1,1'-biadamantane, 3,3',5,5'-tetramethyl-7,7'-bis(4-methylethynylphenyl)-1,1'-biadamantane, 3,3'-bis(3,4-dimethylethynylphenyl)-1, 1'-biadamantane, 3,3',5,5'-tetramethyl-7,7'-bis(3,5-dimethylethynylphenyl)-1,1'-biadamantane, 3,3',5,5'-tetramethyl-7,7'-bis(3,5-diphenylethynylphenyl)-1,1'-biadamantane and the like, and especially preferred are 3,3',5,5'-tetramethyl-7,7'-bis(3,5-diethynylphenyl)-1,1'-biadamantane and 3,3',5,5'-tetramethyl-7,7'-bis(3,5-diphenylethynylphenyl)-1,1'-biadamantane from the viewpoint of solubility and heat resistance. Among the specific examples of cage structure compounds having a polymerizable unsaturated bond-containing group and a cage structure with an adamantane structure as the minimal unit, there may be mentioned those with diamantane compounds as the polyamantane structure, with no limitation to these. Also, biadamantane compounds were mentioned as polyadamantane structures, but they may also be other adamantane compounds or polyamantane compounds wherein n is 2 or greater in the compounds represented by general formula (1).

The method of polymerizing the cage structure compound having a polymerizable unsaturated bond group-containing group and a cage structure with an adamantane structure as the minimal unit, for a prepolymer of a cage structure compound having a polymerizable unsaturated bond-containing group and a cage structure with an adamantane structure as the minimal unit, as used according to the invention, may be a known polymerization method that allows reaction of polymerizable unsaturated bond groups. As examples of polymerization methods there may be mentioned methods based on radical polymerization using radical initiators such as benzoyl peroxide, t-butyl peroxide or azobisisobutyronitrile, methods based on photoradical polymerization using photoirradiation or the like, methods based on polymerization using palladium catalysts such as dichlorobis(triphenylphosphine)palladium(II), bis(benzonitrile)palladium(II) dichloride or tetrakis(triphenylphosphine)palladium(0), methods based on thermal polymerization, methods based on polymerization using transition catalysts such as copper(II) acetate, and methods based on polymerization using transition metal chlorides such as molybdenum(V) chloride, tungsten(VI) chloride or tantalum(V) chloride.

Preferred among these are methods based on thermal polymerization, because they do not require removal of impurities from residual catalyst and the like. The reaction conditions may be appropriately varied based on the structure of the cage structure compound having the polymerizable unsaturated bond-containing group and the cage structure with an adamantane structure as the minimal unit. The reaction temperature will differ depending on the polymerizable unsaturated bond group, but normally it will be between about 50° C. and 500° C., and the concentration of the cage structure compound in the organic solvent will normally be between about 1 wt % and 50 wt %. The cage structure compound is preferably dissolved in the organic solvent for thermal polymerization. The reaction temperature and the concentration of the cage structure compound during the reaction may be outside of these ranges, but if either is too high the molecular weight may be increased, causing insolubilization of the organic solvent.

The polymerization reaction will normally proceed by reaction of all or a portion of the unsaturated bonds in the cage structure compound having a polymerizable unsaturated bond group-containing group and a cage structure with an adamantane structure as the minimal unit.

The prepolymer obtained in this manner preferably has an unsaturated bond produced by reaction between the polymerizable unsaturated bonds of the cage structure compound, or an unsaturated bond produced by reaction between the polymerizable unsaturated bonds and an unreacted polymerizable unsaturated bond.

As a specific example, when a structure represented by formula (1) has a polymerizable unsaturated bond group-containing group as the carbon-carbon triple bond and the portion other than the polymerizable unsaturated bond-containing group is represented by Y, so that formula (1) is simplified to formula (7), the structure adopted by the compound represented by formula (1) as a result of the polymerization reaction may be, for example, the structures represented by any of those of formula (8), although there is no restriction to these structures.

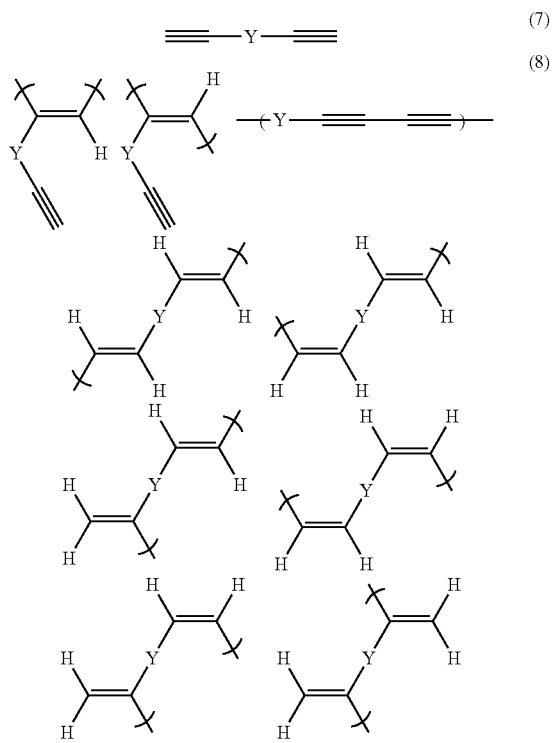

The examples represented by formula (8) above are examples with reaction of the carbon-carbon triple bonds of groups containing one or two carbon-carbon triple bonds in the compounds represented by formula (1), but the reaction may also be by the carbon-carbon triple bonds of a group containing multiple carbon-carbon triple bonds.

More preferably, some of the unreacted carbon-carbon triple bonds are left in the prepolymer obtained by the aforementioned polymerization reaction, as shown in formula (8), in order to improve the heat resistance and elastic modulus by crosslinking reaction during formation of the resin film, and in order to improve the solubility in organic solvents. The residue rate of unreacted polymerizable unsaturated bonds in the prepolymer is preferably between 20% and 80%.

The residue rate of carbon-carbon triple bonds can be measured, for example, by infrared absorption spectrometry (IR spectrometry) or Raman spectroscopy. More specifically, the residue rate of carbon-carbon triple bonds can be calculated based on the change between the absorption spectrum for the carbon-carbon triple bonds in the cage structure compound having the polymerizable unsaturated bond group-containing group prior to reaction, and the absorption spectrum for the carbon-carbon triple bonds of the prepolymer. In this case, it is necessary to remove the unreacted cage structure compound from the prepolymer, by separation based on differences in solubility or separation by fractionation or the like.

An organic solvent may be used as the reaction solvent for the aforementioned polymerization reactions, but there is no particular restriction to such organic solvents, and for example, alcohol-based solvents such as methanol, ethanol, isopropanol, 1-butanol and 2-butanol; ketone-based solvents such as acetylacetone, methyl ethyl ketone, methyl isobutyl ketone, cyclohexanone, cyclopentanone, 2-pentanone and 2-heptanone; esteric solvents such as ethyl acetate, propyl acetate, butyl acetate, pentyl acetate and propyleneglycol monomethyl ether acetate; ether-based solvents such as diisopropyl ether, dibutyl ether, tetrahydrofuran, anisole and 1,3-dimethoxybenzene; aromatic hydrocarbon-based solvents such as benzene, toluene, mesitylene, ethylbenzene, diethylbenzene and propylbenzene; and amide-based solvents such as N-methylpyrrolidone, are industrially available and therefore suitable solvents, and any of these may be used alone or in combinations of two or more.

An organic insulating film material of the invention comprises a prepolymer of a cage structure compound obtained in the manner described above, having a polymerizable unsaturated bond group-containing group and a cage structure with an adamantane structure as the minimal unit, and the components other than this compound may contain organic solvents or they may contain the additives of the varnish for resin film described hereunder.

A varnish for resin film according to the invention can be obtained by dissolving an organic insulating material according to the invention in a suitable organic solvent. The organic insulating material may be dried and solidified and then dissolved in an organic solvent to produce a resin film varnish, the reaction mixture obtained by production of the organic insulating material may be directly used as a varnish, or a special organic solvent may be combined with the reaction mixture. As organic solvents to be used for varnishes for resin film there may be mentioned any ones that can dissolve or disperse the organic insulating material, without any particular restrictions, and the same organic solvent used for the polymerization reaction may be employed. The concentration of the varnish for resin film may be set as appropriate for the structure and molecular weight of the organic insulating material, but the organic insulating material is preferably used at between 0.1 wt % and 50 wt % and more preferably between 0.5 wt % and 15 wt % in the varnish for resin film.

If necessary, there may be added to the varnish for resin film various additives including surfactants, coupling agents of which silane coupling agents are typical, radical initiators that generate oxygen radicals or sulfur radicals under heat, and catalysts such as disulfides, for use as a resin composition.

Addition of a naphthoquinonediazide compound as a photosensitive agent to the varnish for resin film will allow its use as a surface protecting film with a photosensitive property.

A foaming agent that forms nanosize micropores (a porogen, or pore generator) may also be added to the varnish for resin film.

The resin film will now be explained.

The resin film of the invention is obtained using the aforementioned organic insulating material or varnish for resin film, and for example, the varnish for resin film obtained as described above may be coated onto a support such as a board, and treated by heat or active irradiation. It may also be produced by coating a support with the reaction mixture obtained as described above directly or with the organic insulating material after heating and dissolution.

Treatment such as heating or active irradiation can yield a more excellent resin film in terms of heat resistance and elastic modulus, by causing crosslinking reaction between the polymerizable unsaturated bonds in the prepolymer.

As a specific example of using a resin film varnish in a process for producing a resin film according to the invention, first the resin film varnish is coated onto an appropriate support such as, for example, a base material, which may be an organic base such as a polyester film, a metal board such as a copper foil or a semiconductor board such as a silicon wafer or ceramic board, to form a coated film. The coating method may be spin coating using a spinner, spray coating using a spray coater, dipping, printing, roll coating or the like. The coated film may then be dried and treated with heat or the like to remove the solvent, and then subjected to crosslinking reaction by a method of heating, a method of irradiating an active energy beam or a method involving both, to obtain a resin film with excellent mechanical properties. The method by heating may involve, for example, heating at 150-425° C.×5 minutes–24 hours. As active energy beams there may be mentioned active energy light rays such as visible light, ultraviolet light, infrared light or laser light, or X-rays, electron beams and microwaves.

The resin film of the invention may be directly coated onto a substrate such as a semiconductor board by a method mentioned above, or a resin film formed on a support such as an organic base material may be released from the support for use as a dry film.

In order to increase the adhesiveness with the board or other support, a cohesive layer may be formed on the board and the resin film formed thereover.

As examples of uses for the resin film, there may be mentioned semiconductor interlayer insulating films and surface protecting films, multilayer circuit interlayer insulating films, flexible copper-clad sheet cover coats, solder resist films, liquid crystal oriented films, etching protective films (etching stoppers), adhesives and the like. Most suitable among these are semiconductor interlayer insulating films, surface protecting films and etching protective films.

The glass transition temperature of the organic insulating material used is not particularly restricted but is preferably at least 400° C., more preferably at least 420° C. and most preferably 450-500° C. With a glass transition temperature within this range, the linear expansion coefficient of the resin film can be reduced and a resin film with excellent dimensional stability can be obtained.

The thickness of the resin film is not particularly restricted, but it is preferably 0.01-20 μm, more preferably 0.05-10 μm and most preferably 0.1-0.7 μm, for a semiconductor interlayer insulating film or the like. A thickness within this range will result in excellent suitability for semiconductor production processes.

When the resin film is used as a semiconductor interlayer insulating film, the organic insulating material or varnish for resin film is directly coated onto prescribed locations of a silicon wafer or ceramic board to form a coated film. The coating method may be spin coating using a spinner, spray coating using a spray coater, dipping, printing, roll coating or the like. The coated film may then be dried, the solvent removed, and the film then subjected to crosslinking reaction by a method of heating as mentioned above, a method of irradiating an active energy beam, or a method involving both, to obtain an interlayer insulating film. Alternatively, the varnish for resin film may be used as a dry film and laminated at the prescribed location.

When the resin film is used as a semiconductor protecting film, the organic insulating material or resin film varnish is directly coated onto prescribed locations of a silicon wafer or ceramic board to form a coated film, in the same manner as a semiconductor interlayer insulating film explained above. The coating method may be spin coating using a spinner, spray coating using a spray coater, dipping, printing, roll coating or the like. The coated film may then be dried, the solvent removed, and the film then subjected to crosslinking reaction by a method of heating as mentioned above, a method of irradiating an active energy beam, or a method involving both, to obtain a protecting film composed of a resin film.

The thickness of the semiconductor protecting film is not particularly restricted, but it is preferably 0.05-70 μm and more preferably 0.1-50 μm. A thickness within this range will result in excellent protective properties and workability of the semiconductor element.

A preferred embodiment of a semiconductor device according to the invention will now be explained.

FIG. 1 is a schematic cross-sectional view showing an example of a semiconductor device according to the invention.

The semiconductor device 100 comprises a semiconductor board 1 on which an element is formed, a silicon nitride film 2 provided above the semiconductor board 1 (the top in FIG. 1), and a copper wiring layer 4 covered with an interlayer insulating film 3 and a barrier layer 6, formed on the silicon nitride film 2.

Recesses corresponding to a wiring pattern are formed in the interlayer insulating film 3, and the copper wiring layer 4 is formed in the recesses.

A reforming treatment layer 5 is provided between the interlayer insulating film 3 and copper wiring layer 4.

A hard mask layer 7 is also formed above the interlayer insulating film 3 (the side opposite the silicon nitride film 2).

As a method of forming the interlayer insulating film 3, it may be formed by directly coating the varnish onto the silicon nitride film 2 of the semiconductor board 1, but alternatively it may be formed by preparing a dry film of the resin film beforehand and laminating it on the silicon nitride film 2 of the semiconductor board 1. More specifically, a coating varnish containing an organic insulating material obtained in the manner described above may be directly coated onto the silicon nitride film 2 of the semiconductor board 1 to form a coated film, and the film hardened by irradiation with heat and/or an active energy beam. When a dry film is used, the coating varnish containing the organic insulating material obtained in the manner described above may be used to form a resin layer on a substrate and dried to form a dry film, which is then laminated on the silicon nitride film 2 of the semiconductor board 1 and irradiated with heat and/or an active energy beam to harden it.

The explanation provided above assumes an example of formation on the silicon nitride film 2, but the position of the resin film is not limited to this.

Also, a semiconductor device 100 employing an interlayer insulating film 3 was explained for this embodiment, but the invention is not limited to such a construction.

Since an interlayer insulating film as described above is used in the semiconductor device of the invention, the dimensional precision is excellent and a sufficient insulating property is exhibited, so that excellent connection reliability is obtained.

Furthermore, since the interlayer insulating film as described above also has excellent dielectric characteristics, the wiring delay can be reduced.

EXAMPLES

The present invention will now be explained in greater detail based on examples and comparative examples, with the understanding that the invention is in no way limited to the examples.

Example 1

(1) Synthesis of 3,3',5,5'-tetraethynyl-1,1'-biadamantane

After placing 14 g (0.6 mol) of metallic sodium and 600 ml of n-octane in a 1000 mL four-necked flask equipped with a thermometer, stirrer and reflux tube, the internal temperature was cooled to 0° C. Next, 64.5 g (0.3 mol) of 1-bromoadamantane pre-dissolved in 300 ml of n-octane was slowly added dropwise while vigorously stirring. The internal temperature during the dropwise addition was kept at 0° C.-5° C. Upon cessation of temperature increase after completion of the dropwise addition, reaction was continued for 1 hour. The mixture was then poured into approximately 1500 mL of cold water and the crude product was filtered out, washed with purified water and dried. The crude product was further recrystallized from hot hexane. The obtained recrystallized product was dried under reduced pressure to obtain 32.6 g of a product. The Br group absorption (near 690-515 $cm^{-1}$) in IR analysis disappeared and mass spectrometry revealed a molecular weight of 270, thus indicating that the product was 1,1'-biadamantane.

After placing 700 mL of carbon tetrachloride and 70 g (0.44 mol) of bromine in a 2000 mL 4-necked flask equipped with a thermometer, stirrer and reflux tube, 54.1 g (0.2 mol) of the previously obtained 1,1'-biadamantane was added in small portions at a time while stirring. The internal temperature was kept at 20° C.-30° C. during the addition. Upon cessation of temperature increase after completion of the addition, reaction was continued for 1 hour. The mixture was then poured into approximately 2000 mL of cold water and the crude product was filtered out, washed with purified water and dried. The crude product was recrystallized from hot ethanol. The obtained recrystallized product was dried under reduced pressure to obtain 65.0 g of a product. Bromo group absorption was seen at 690-515 $cm^{-1}$ by IR analysis and the molecular weight by mass spectrometry was 586, thus indicating that the product was 3,3',5,5'-tetrabromo-1,1'-biadamantane.

After dissolving 20 g (34 mmol) of the obtained 3,3',5,5'-tetrabromo-1,1'-biadamantane and 18 ml (256 mmol) of bromoethene in 120 ml of dichloromethane in a flask, 3.0 g (22 mmol) of aluminum(III) chloride was added dropwise at −15° C. under dry nitrogen and the mixture was stirred for 1 hour. After then adding 20 ml of water dropwise at −15° C., it was returned to room temperature to obtain a reaction mixture. The reaction mixture was added to 200 ml of a 10% hydrochloric acid aqueous solution, the mixture was extracted 3 times using 40 ml of dichloromethane each time and then washed with 40 ml of water and dried over magnesium sulfate, and the organic layer was concentrated to obtain 18.2 g of 3,3',5,5'-tetrakis(dibromoethyl)-1,1'-biadamantane.

The obtained 3,3',5,5'-tetrakis(dibromoethyl)-1,1'-biadamantane was dissolved in 200 ml of dimethyl sulfoxide, and then 28 g (250 mmol) of potassium tert-butoxide was added at room temperature and the mixture was stirred for 48 hours. The reaction mixture was added to 400 ml of water, the mixture was extracted 3 times using 200 ml of dichloromethane each time and then washed with 200 ml of water and dried over magnesium sulfate, and the organic layer was concentrated to obtain 11.0 g of 3,3',5,5'-tetraethynyl-1,1'-biadamantane.

Outer appearance: white solid
MS (FD) (m/z): 367 (M$^+$)
Elemental analysis: Calculated (/%): C, 91.75; H, 8.25. Found (/%): C, 91.54; H, 8.13.

(2) Polymerization of 3,3',5,5'-tetraethynyl-1,1'-biadamantane and Production of Varnish for Organic Insulating Film After dissolving 5 g of the 3,3',5,5'-tetraethynyl-1,1'-biadamantane obtained in Example 1(1) in 45 g of 1,3-dimethoxybenzene, 0.1 g of bis(benzonitrile)palladium(II) dichloride was added, reaction was conducted at 190° C. for 6 hours under dry nitrogen, and the reaction mixture was dropped into a 10-fold volume of methanol to produce a precipitate, which was collected and dried to obtain a prepolymer. The molecular weight of the obtained prepolymer was determined using a gel permeation chromatograph (GPC) by Tosoh Corp. based on polystyrene, and the number-average molecular weight (Mn) was 18,200. The unreacted unsaturated bond residue rate of the prepolymer was calculated by the ratio of the absorbances of the IR spectrum for the carbon-carbon triple bonds of the polyadamantane structure compound before reaction and the IR spectrum for the carbon-carbon triple bonds of the prepolymer, and the unreacted unsaturated bond residue rate was 61%. The IR analysis was performed using an FTIR8900 by SHIMADZU. A 3 g portion of the obtained prepolymer was dissolved in 27 g of cyclopentanone and filtered with a Teflon® filter to obtain a varnish for organic insulating film.

(3) Production of Interlayer Insulating Film and Semiconductor Device

A silicon nitride layer was formed on a semiconductor board, and the aforementioned organic insulating film varnish was coated onto the silicon nitride layer and subjected to heat treatment at 400° C. for 1 hour to form an interlayer insulating film with a 0.1 μm thickness.

Next, a metal wiring was formed on the interlayer insulating film in a prescribed pattern, to obtain a semiconductor device.

Example 2

(1) Synthesis of 3,3',5,5'-tetramethyl-7,7'-diethynyl-1,1'-biadamantane

Except for using 72.9 g (0.3 mol) of 1-bromo-3,5-dimethyladamantane instead of 64.5 g (0.3 mol) of 1-bromoadamantane and using 35 g (0.22 mol) of bromine in Example 1(1), the procedure was otherwise carried out in the same manner as Example 1(1) to obtain 58 g of a product. Bromo group absorption was seen at 690-515 cm$^{-1}$ by IR analysis and the molecular weight by mass spectrometry was 484, thus indicating that the product was 3,3',5,5'-tetramethyl-7,7'-dibromo-1,1'-biadamantane.

Except for using 50 g (103 mmol) of the obtained 3,3',5,5'-tetramethyl-7,7'-dibromo-1,1'-biadamantane instead of 20 g (34 mmol) of 3,3',5,5'-tetrabromo-1,1'-biadamantane, 27.25 ml (387.5 mmol) instead of 18 ml (256 mol) of bromoethene and 4.55 g (33.3 mmol) instead of 3.0 g (22 mol) of aluminum(III) chloride in Example 1(1), the procedure was otherwise carried out as in Example 1(1) to obtain 31.5 g of 3,3',5,5'-tetramethyl-7,7'-diethynyl-1,1'-biadamantane.

Outer appearance: white solid
MS (FD) (m/z): 374 (M$^+$)
Elemental analysis: Calculated (/%): C, 89.78; H, 10.22. Found (/%): C, 89.70; H, 10.13.

(2) Polymerization of 3,3',5,5'-tetramethyl-7,7'-diethynyl-1,1'-biadamantane and Production of Varnish for Organic Insulating Film A prepolymer was obtained in the same manner as Example 1(2), except for using 5 g of the 3,3',5,5'-tetramethyl-7,7'-diethynyl-1,1'-biadamantane obtained in Example 2(1) instead of the 5 g of 3,3',5,5'-tetraethynyl-1,1'-biadamantane in Example 1(2). The number-average molecular weight of the obtained prepolymer was 21,300. The unreacted unsaturated bond residue rate was 21%. A 3 g portion of the obtained prepolymer was dissolved in 27 g of cyclopentanone and filtered with a filter to obtain a varnish for organic insulating film.

(3) Production of Interlayer Insulating Film and Semiconductor Device

The previously obtained varnish for organic insulating film was used for the same procedure as Example 1(3) to obtain a semiconductor device.

Example 3

(1) Synthesis of 4,9-diethynyldiamantane

Except for using 30 g (87 mmol) of 4,9-dibromodiamantane instead of 20 g (34 mmol) of the 3,3',5,5'-tetrabromo-1,1'-biadamantane obtained by synthesis for Example 1(1), 23.4 ml (326 mmol) instead of 18 ml (256 mmol) of bromoethene and 3.7 g (28 mmol) instead of 3.0 g (22 mmol) of aluminum(III) chloride, the procedure was otherwise carried out in the same manner as Example 1(1) to obtain 17 g of 4,9-diethynyldiamantane.

Outer appearance: white solid
MS (FD) (m/z): 236 (M$^+$)
Elemental analysis: Calculated (/%): C, 91.47; H, 8.53. Found (/%): C, 91.38; H, 8.49.

(2) Polymerization of 4,9-diethynyldiamantane and Production of Varnish for Organic Insulating Film A prepolymer was obtained in the same manner as Example 1(2), except for using 5 g of the 4,9-diethynyldiamantane obtained in Example 3(1) instead of the 5 g of 3,3',5,5'-tetraethynyl-1,1'-biadamantane in Example 1(2). The number-average molecular weight of the obtained prepolymer was 36,500. The unreacted unsaturated bond residue rate was 25%. A 3 g portion of the obtained prepolymer was dissolved in 27 g of cyclopentanone and filtered with a filter to obtain a varnish for organic insulating film.

(3) Production of Interlayer Insulating Film and Semiconductor Device

The previously obtained varnish for organic insulating film was used for the same procedure as Example 1(3) to obtain a semiconductor device.

Example 4

(1) Synthesis of 3,3',5,5'-tetramethyl-7,7'-bis(phenylethynyl)-1,1'-biadamantane After dissolving 10 g (26.7 mmol) of 3,3',5,5'-tetramethyl-7,7'-diethynyl-1,1'-biadamantane obtained by the same procedure as Example 2(1) and 12.5 g (79.6 mmol) of bromobenzene in 40 ml of triethylamine and 20 ml of pyridine in a flask, 0.062 g (0.33 mmol) of copper(II) iodide and 0.24 g (0.91 mmol) of triphenylphosphine were added. Next, 0.058 g (0.082 mmol) of dichlorobis(triphenylphosphine)palladium (II) was added and the mixture was reacted at 110° C. for 5 hours under a dry nitrogen atmosphere. After the reaction, the triethylamine and pyridine were distilled off and 500 ml of a 2 mol/L hydrochloric acid aqueous solution was added to deposit a precipitate. The precipitate was filtered and washed with 500 ml of water and 500 ml of methanol, and then a vacuum dryer was used for 24 hours of drying in a 60° C. atmosphere to obtain 9.7 g of 3,3',5,5'-tetramethyl-7,7'-bis(phenylethynyl)-1,1'-biadamantane.

Outer appearance: white solid
MS (FD) (m/z): 526 ($M^+$)
Elemental analysis: Calculated (/%): C, 91.20; H, 8.80. Found (/%): C, 91.17, H, 8.79.

(2) Polymerization of 3,3',5,5'-tetramethyl-7,7'-bis(phenylethynyl)-1,1'-biadamantane and Production of Varnish for Organic Insulating Film After dissolving 5 g of the previously obtained 3,3',5,5'-tetramethyl-7,7'-bis(phenylethynyl)-1,1'-biadamantane in 45 g of 1,3-dimethoxybenzene, reaction was conducted at 190° C. for 6 hours under dry nitrogen, and the reaction mixture was dropped into a 10-fold volume of methanol to produce a precipitate, which was collected and dried to obtain a prepolymer. The number-average molecular weight of the obtained prepolymer was 32,100. The unreacted unsaturated bond residue rate was 23%. A 3 g portion of the obtained prepolymer was dissolved in 27 g of cyclopentanone and filtered with a filter to obtain a varnish for organic insulating film.

(3) Production of Interlayer Insulating Film and Semiconductor Device

The previously obtained varnish for organic insulating film was used for the same procedure as Example 1(3) to obtain a semiconductor device.

Example 5

(1) Synthesis of 3,3',5,5'-tetramethyl-7,7'-bis(3,5-diethynylphenyl)-1,1'-biadamantane After stirring 50 g (103.2 mmol) of 3,3',5,5'-tetramethyl-7,7'-dibromo-1,1'-biadamantane obtained by the same procedure as Example 2(1) and 1217 g (5161.6 mmol) of 1,3-dibromobenzene in a flask, 24.8 g (93.0 mmol) of aluminum (III) bromide was added dropwise in small portions at a time at 25° C. under dry nitrogen. The mixture was raised to a temperature of 60° C. and stirred for 8 hours, and then returned to room temperature to obtain a reaction mixture. The reaction mixture was added to 700 ml of a 5% hydrochloric acid aqueous solution and stirred. The aqueous layer was removed and the organic layer was added to 2000 ml of acetone. The precipitate was filtered and washed 3 times with 1000 ml of acetone to obtain 70 g of 3,3',5,5'-tetramethyl-7,7'-bis(3,5-dibromophenyl)-1,1'-biadamantane.

Next, 50 g (62.9 mmol) of the previously obtained 3,3',5,5'-tetramethyl-7,7'-bis(3,5-dibromophenyl)-1,1'-biadamantane, 3.53 g (5.0 mmol) of dichlorobistriphenylphosphinepalladium, 6.60 g (25.2 mmol) of triphenylphosphine, 4.79 g (25.2 mmol) of copper(II) iodide and 750 ml of triethylamine were added to a flask and stirred. The mixture was raised to 75° C., and then 37.1 g (377.7 mmol) of trimethylsilylacetylene was slowly added. After stirring at 75° C. for 7 hours, the temperature was raised to 120° C. to remove the triethylamine. After returning to room temperature, 1000 ml of dichloromethane was added to the reaction mixture and stirring was continued for 20 minutes. The precipitate was removed by filtration, and 1000 ml of a 5% hydrochloric acid aqueous solution was added to the filtrate for liquid separation. The organic layer was washed three times with 1000 ml of water, and then the solvent of the organic layer was removed under reduced pressure. The obtained compound was dissolved in 1500 ml of hexane. The insoluble portion was removed by filtration and the hexane in the filtrate was removed under reduced pressure. After introducing 1000 ml of acetone thereinto, the precipitate was washed 3 times with acetone to obtain 43 g of 3,3',5,5'-tetramethyl-7,7'-bis[3,5-bis(trimethylsilylethynyl)phenyl]-1,1'-biadamantane.

Next, 39.8 g (53.5 mmol) of the previously obtained 3,3',5,5'-tetramethyl-7,7'-bis[3,5-bis(trimethylsilylethynyl)phenyl]-1,1'-biadamantane and 1.46 g (10.6 mmol) of potassium carbonate were stirred in a mixed solvent comprising 600 ml of tetrahydrofuran and 300 ml of methanol, for 4 hours under a nitrogen atmosphere at room temperature. This was added to 1000 ml of a 10% hydrochloric acid aqueous solution, and the precipitate was filtered and washed with 1000 ml of water and then with 1000 ml of acetone, after which it was dried to obtain 21.2 g of 3,3',5,5'-tetramethyl-7,7'-bis(3,5-diethynylphenyl)-1,1'-biadamantane.

Outer appearance: white solid
MS (FD) (m/z): 574 ($M^+$)
Elemental analysis: Calculated (/%): C, 91.93; H, 8.07. Found (/%): C, 91.87; H, 8.00.

(2) Polymerization of 3,3',5,5'-tetramethyl-7,7'-bis(3,5-diethynylphenyl)-1,1'-biadamantane and Production of Varnish for Organic Insulating Film A prepolymer was obtained in the same manner as Example 4(2), except for using 5 g of the 3,3',5,5'-tetramethyl-7,7'-bis(3,5-diethynylphenyl)-1,1'-biadamantane obtained in Example 5(1) instead of the 5 g of 3,3',5,5'-tetramethyl-7,7'-bis(phenylethynyl)-1,1'-biadamantane in Example 4(2). The number-average molecular weight of the obtained prepolymer was 46,600. The unreacted unsaturated bond residue rate was 45%. A 3 g portion of the obtained prepolymer was dissolved in 27 g of cyclopentanone and filtered with a filter to obtain a varnish for organic insulating film.

(3) Production of Interlayer Insulating Film and Semiconductor Device

The previously obtained varnish for organic insulating film was used for the same procedure as Example 1(3) to obtain a semiconductor device.

Example 6

(1) Synthesis of 4,9-bis(3,5-diethynylphenyl)diamantane

Except for using 35.7 g (103.2 mmol) of 4,9-dibromodiamantane instead of 50 g (103.2 mmol) of 3,3',5,5'-tetramethyl-7,7'-dibromo-1,1'-biadamantane, as in Example 5(1), the procedure was otherwise carried out in the same manner as Example 5(1) to obtain 38 g of 4,9-bis(3,5-diethynylphenyl)diamantane.

Outer appearance: white solid
MS (FD) (m/z): 436 (M$^+$)
Elemental analysis: Calculated (/%): C, 93.54; H, 6.46. Found (/%): C, 93.61; H, 6.47.

(2) Polymerization of 4,9-bis(3,5-diethynylphenyl)diamantane and Production of Varnish for Organic Insulating Film A prepolymer was obtained in the same manner as Example 4(2), except for using the 5 g of 4,9-bis(3,5-diethynylphenyl)diamantane obtained in Example 6(1) instead of the 5 g of 3,3',5,5'-tetramethyl-7,7'-bis(phenylethynyl)-1,1'-biadamantane in Example 4(2). The number-average molecular weight of the obtained prepolymer was 50,100. The unreacted unsaturated bond residue rate was 25%. A 3 g portion of the obtained prepolymer was dissolved in 27 g of cyclopentanone and filtered with a filter to obtain a varnish for organic insulating film.

(3) Production of Interlayer Insulating Film and Semiconductor Device

The previously obtained varnish for organic insulating film was used for the same procedure as Example 1(3) to obtain a semiconductor device.

Example 7

(1) Synthesis of 9,9'-bis(3,5-diethynylphenyl)-4,4'-bidiamantane

Except for using 80.2 g (0.3 mol) of 4-bromo-diamantane instead of 64.5 g (0.3 mol) of 1-bromoadamantane and using 35 g (0.22 mol) of bromine in Example 1(1), the procedure was otherwise carried out in the same manner as Example 1(1) to obtain 70 g of a product. Bromo group absorption was seen at 690-515 cm$^{-1}$ by IR analysis and the molecular weight by mass spectrometry was 532, thus indicating that the product was 9,9'-dibromo-4,4'-bi(diamantane).

Except for using 54.9 g (103.2 mmol) of the previously obtained 9,9'-dibromo-4,4'-bi(diamantane) instead of the 50 g (103.2 mmol) of 3,3',5,5'-tetramethyl-7,7'-dibromo-1,1'-biadamantane used in Example 5(1), the procedure was otherwise carried out as in Example 5(1) to obtain 31 g of 9,9'-bis(3,5-diethynylphenyl)-4,4'-bi(diamantane).

Outer appearance: white solid
MS (FD) (m/z): 622 (M$^+$)
Elemental analysis: Calculated (/%): C, 92.56; H, 7.44. Found (/%): C, 92.12; H, 7.30.

(2) Polymerization of 9,9'-bis(3,5-diethynylphenyl)-4,4'-bidiamantane and Production of Varnish for Organic Insulating Film A prepolymer was obtained in the same manner as Example 4(2), except for using the 5 g of 9,9'-bis(3,5-diethynylphenyl)-4,4'-bidiamantane obtained in Example 7(1) instead of the 5 g of 3,3',5,5'-tetramethyl-7,7'-bis(phenylethynyl)-1,1'-biadamantane in Example 4(2). The number-average molecular weight of the obtained prepolymer was 67,200. The unreacted unsaturated bond residue rate was 38%. A 3 g portion of the obtained prepolymer was dissolved in 27 g of cyclopentanone and filtered with a filter to obtain a varnish for organic insulating film.

(3) Production of Interlayer Insulating Film and Semiconductor Device

The previously obtained varnish for organic insulating film was used for the same procedure as Example 1(3) to obtain a semiconductor device.

Example 8

(1) Synthesis of 3,3',5,5'-tetramethyl-7,7'-bis[3,5-bis(phenylethynyl)phenyl]-1,1'-biadamantane Except for using 10.6 g (13.4 mmol) of the 3,3',5,5'-tetramethyl-7,7'-bis(3,5-dibromophenyl)-1,1'-biadamantane obtained during the synthesis of Example 5(1) instead of the 10 g (26.7 mmol) of 3,3',5,5-tetramethyl-7,7'-diethynyl-1,1'-biadamantane in Example 4(1), and using 8.1 g (79.6 mmol) of ethynylbenzene instead of 12.5 g (79.6 mmol) of bromobenzene, the procedure was otherwise carried out in the same manner as Example 4(1) to obtain 11.6 g of 3,3',5,5'-tetramethyl-7,7'-bis[3,5-bis(phenylethynyl)phenyl]-1,1'-biadamantane.

Outer appearance: white solid
MS (FD) (m/z): 878 (M$^+$)
Elemental analysis: Calculated (/%): C, 92.89; H, 7.11. Found (/%): C, 92.95; H, 7.05.

(2) Polymerization of 3,3',5,5'-tetramethyl-7,7'-bis[3,5-bis(phenylethynyl)phenyl]-1,1'-biadamantane and Production of Varnish for Organic Insulating Film A prepolymer was obtained in the same manner as Example 4(2), except for using the 5 g of 3,3',5,5'-tetramethyl-7,7'-bis[3,5-bis(phenylethynyl)phenyl]-1,1'-biadamantane instead of the 5 g of 3,3',5,5'-tetramethyl-7,7'-bis(phenylethynyl)-1,1'-biadamantane in Example 4(2). The number-average molecular weight of the obtained prepolymer was 70,700. The unreacted unsaturated bond residue rate was 36%. A 3 g portion of the obtained prepolymer was dissolved in 27 g of cyclopentanone and filtered with a filter to obtain a varnish for organic insulating film.

(3) Production of Interlayer Insulating Film and Semiconductor Device

The previously obtained varnish for organic insulating film was used for the same procedure as Example 1(3) to obtain a semiconductor device.

Example 9

(1) Synthesis of 3,3'''-bis(methylethynyl)-5,7,5',7',5'',7'',5''',7'''-octamethyl-1,1':3',1'':3'',1'''-tetraadamantane After dissolving 55 g (68 mmol) of 3,3'''-dibromo-5,7,5',7',5'',7'',5''',7'''-octamethyl-1,1':3',1'':3'',1'''-tetraadamantane and 18 ml (256 mmol) of bromoethene in 240 ml of dichloromethane in a flask, 3.0 g (22 mmol) of aluminum(III) chloride was added dropwise at −15° C. under dry nitrogen and the mixture was stirred for 1 hour. After then adding 40 ml of water dropwise at −15° C., it was returned to room temperature to obtain a reaction mixture. The reaction mixture was added to 400 ml of a 10% hydrochloric acid aqueous solution and extracted 3 times using 80 ml of dichloromethane each time, and then washed with 80 ml of water and dried over magnesium sulfate, and the organic layer was concentrated to obtain 50.2 g of 3,3'''-bis(bromoethyl)dibromoethyl-5,7,5',7',5'',7'',5''',7'''-octamethyl-1,1':3',1'':3'',1'''-tetraadamantane.

A 42 g (53 mmol) portion of the obtained 3,3'''-bis(bromoethyl)-5,7,5',7',5'',7'',5''',7'''-octamethyl-1,1':3',1'':3'',1'''-tetraadamantane was then dissolved in 400 ml of dimethyl sulfoxide and 28 g (250 mmol) of potassium tert-butoxide was added at room temperature, after which the mixture was stirred for 48 hours. The reaction mixture was then added to 800 ml of water and extracted 3 times using 400 ml of dichloromethane each time, and after washing with 400 ml of water, it was dried over magnesium sulfate and the organic layer was concentrated to obtain 36.1 g of 3,3'''-diethynyl-5,7,5',7',5'',7'',5''',7'''-octamethyl-1,1':3',1'':3'',1'''-tetraadamantane.

Next, 36.1 g of the obtained 3,3'''-diethynyl-5,7,5',7',5'',7'',5''',7'''-octamethyl-1,1':3',1'':3'',1'''-tetraadamantane and 22.7 g (160 mmol) of methyl iodide were dissolved in 80 ml of triethylamine and 40 ml of pyridine, and then 0.124 g (0.66 mmol) g of copper(II) iodide and 0.48 g (1.82 mmol) of triphenylphosphine were added. Next, 0.116 g (0.164 mmol) of dichlorobis(triphenylphosphine)palladium(II) was added and the mixture was reacted at 110° C. for 5 hours under a dry nitrogen atmosphere. After the reaction, the triethylamine and pyridine were distilled off and 1000 ml of a 2 mol/L hydrochloric acid aqueous solution was added to deposit a precipitate. The precipitate was filtered and washed with 1000 ml of water and 1000 ml of methanol, and a vacuum dryer was used for 24 hours of drying in an atmosphere at 60° C. to obtain 32.8 g of 3,3'''-bis(methylethynyl)-5,7,5',7',5'',7'',5''',7'''-octamethyl-1,1':3',1'':3'',1'''-tetraadamantane.

Outer appearance: white solid
MS (FD) (m/z): 727 ($M^+$)
Elemental analysis: Calculated (/%): C, 89.19; H, 10.81.
Found (/%): C, 89.16; H, 10.76.

(2) Polymerization of 3,3'''-bis(methylethynyl)-5,7,5',7',5'',7'',5''',7'''-octamethyl-1,1':3',1'':3'',1'''-tetraadamantane and Production of Varnish for Organic Insulating Film A prepolymer was obtained in the same manner as Example 1(2), except for using 5 g of the 3,3'''-bis(methylethynyl)-5,7,5',7',5'',7'',5''',7'''-octamethyl-1,1':3',1'':3'',1'''-tetraadamantane obtained in Example 9(1) instead of the 5 g of 3,3',5,5'-tetraethynyl-1,1'-biadamantane in Example 1(2). The number-average molecular weight of the obtained prepolymer was 130,900. The unreacted unsaturated bond residue rate was 23%. A 3 g portion of the obtained prepolymer was dissolved in 27 g of cyclopentanone and filtered with a filter to obtain a varnish for organic insulating film.

(3) Production of Interlayer Insulating Film and Semiconductor Device

The previously obtained varnish for organic insulating film was used for the same procedure as Example 1(3) to obtain a semiconductor device.

Comparative Example 1

A prepolymer was obtained in the same manner as Example 1(2), except for using 5 g of 3,3',5,5'-tetramethyl-7,7'-bis[3,5-bis(phenylethynyl)phenyl]-1,1'-biadamantane instead of the 5 g of 3,3',5,5'-tetraethynyl-1,1'-biadamantane in Example 1(2). The number-average molecular weight of the obtained prepolymer was 550,600. The obtained prepolymer was insoluble in cyclopentanone, and no varnish for organic insulating film could be formed.

Comparative Example 2

A prepolymer was obtained in the same manner as Example 4(2), except for using 5 g of 3,3',5,5'-tetramethyl-7,7'-diethynyl-1,1'-biadamantane instead of the 5 g of 3,3',5,5'-tetramethyl-7,7'-bis(phenylethynyl)-1,1'-biadamantane in Example 4(2). The number-average molecular weight of the obtained prepolymer was 1,600. A 3 g portion of the obtained prepolymer was dissolved in 27 g of cyclopentanone and filtered with a filter to obtain a varnish for organic insulating film. The varnish for organic insulating film was coated by the same procedure as Example 1(3), but it was not possible to form an interlayer insulating film due to a poor external quality.

Comparative Example 3

In a flask there were added 60 ml of tetrahydrofuran, 1.73 g of tetrakistriphenylphosphinepalladium, 0.72 g of copper (II) iodide, 10 ml of piperidine and 54.7 g (120 mmol) of 1,2,4-triiodobenzene. Next, 32.74 g (150 mmol) of 4,4'-diethynyldiphenyl ether was added and reaction was conducted at 25° C. for 20 hours. The reaction mixture was dropped into 1 L of acetic acid and the precipitate was collected and dried to obtain a prepolymer. The number-average molecular weight of the obtained prepolymer was 22,900. The unreacted unsaturated bond residue rate was 28%. A 3 g portion of the obtained prepolymer was dissolved in 27 g of anisole and filtered with a filter to obtain a varnish for organic insulating film. The varnish for organic insulating film was used for the same procedure as Example 1(3) to form an interlayer insulating film and obtain a semiconductor device.

The evaluation described below was carried out for the interlayer insulating films and semiconductor devices obtained in Examples 1-9 and Comparative Example 3. The evaluated parameters are shown together with the methods used. The results are shown in Table 1.

1. Elastic Modulus

Each obtained insulating film was measured using an Ultramicro Hardness Meter ENT-1100 by Elionix Co., Ltd., with a maximum load of 10 mg and a load speed of 1 mg/sec.

2. Relative Permittivity

Following the procedure of JIS-K6911, an HP-4284A Precision LCR Meter by Hewlett Packard was used for volume measurement of the obtained insulating film at a frequency of 100 kHz, and the relative permittivity was calculated by the following formula.

Relative permittivity=(Measured volume value×film thickness)/(vacuum permittivity×measured area)

3. Heat Resistance

The heat resistance was evaluated by the glass transition temperature and thermal decomposition temperature. For the glass transition temperature, the obtained insulating film was measured with a dynamic viscoelasticity measuring apparatus (DMS6100 by Seiko Instruments, Inc.), under conditions with a 300 mL/min nitrogen gas flow, a temperature-elevating rate of 3° C./min and a frequency of 1 Hz, and the tan δ peak top temperature was recorded as the glass transition temperature.

For the thermal decomposition temperature, the obtained insulating film was measured with a TG/DTA measuring apparatus (TG/DTA220 by Seiko Instruments, Inc.) under conditions with a 200 mL/min nitrogen gas flow and a temperature-elevating rate of 10° C./min, and the temperature at which the mass reduction reached 5% was recorded as the thermal decomposition temperature.

TABLE 1

| | Elastic modulus (GPa) | Relative permittivity | Thermal decomposition temperature (° C.) | Glass transition temperature (° C.) |
|---|---|---|---|---|
| Example 1 | 7.42 | 2.26 | 468 | ≧400 |
| Example 2 | 7.05 | 2.28 | 476 | ≧400 |
| Example 3 | 7.00 | 2.38 | 451 | ≧400 |
| Example 4 | 7.11 | 2.48 | 489 | ≧400 |
| Example 5 | 7.70 | 2.29 | 496 | ≧400 |
| Example 6 | 7.53 | 2.46 | 487 | ≧400 |
| Example 7 | 7.22 | 2.27 | 466 | ≧400 |
| Example 8 | 7.09 | 2.54 | 528 | ≧400 |
| Example 9 | 8.57 | 2.24 | 532 | ≧400 |
| Comp. Example 3 | 6.74 | 2.93 | 430 | ≧400 |

According to Table 1, Examples 1-9 all had higher elastic moduli and superior mechanical properties than Comparative Example 3. In addition, Examples 1-9 all had lower relative permittivity values and more excellent dielectric characteristics than Comparative Example 3. In addition, Examples 1-9 all had higher thermal decomposition temperatures and more excellent heat resistance than Comparative Example 3.

The wiring delay speeds of the obtained semiconductor devices were evaluated.

The wiring delays of semiconductor devices obtained using the interlayer insulating films of Examples 1-9 and a semiconductor device with an SiO$_2$ insulating film having the same construction as these semiconductor devices were compared. The signal delay time calculated from the transmission frequency of a ring oscillator was used as the standard for evaluation. Upon comparing both, the semiconductor devices obtained according to the invention were confirmed to have lower wiring delays than the semiconductor device with the SiO$_2$ insulating film, with an average speed increase of about 25%.

INDUSTRIAL APPLICABILITY

According to the invention it is possible to provide organic insulating materials and varnishes for resin film exhibiting low permittivity, high heat resistance and high mechanical strength. Resin films obtained using the organic insulating materials and varnishes for resin film exhibit excellent heat resistance, mechanical properties and electrical characteristics, and especially low permittivity, and therefore semiconductor devices employing them can reduce wiring delay.

What is claimed is:

1. An organic insulating material consisting essentially of a prepolymer of a cage structure compound having a polymerizable unsaturated bond-containing group and a cage structure with an adamantane structure as the minimal unit, wherein the prepolymer has a number-average molecular weight of between 2,000 and 500,000 based on polystyrene and measured by gel permeation chromatography, wherein the prepolymer comprises unsaturated bonds produced by reaction between the polymerizable unsaturated bonds, and the unreacted polymerizable unsaturated bonds, wherein the prepolymer has a residue rate of unreacted polymerizable unsaturated bonds of between 20% and 80%, and wherein the cage structure compound is a compound represented by the following formula (2):

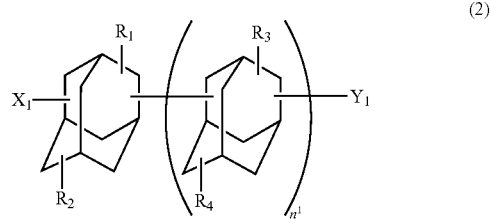

wherein $X_1$ and $Y_1$ each represent one or more groups containing polymerizable unsaturated bonds, and they may be the same or different from each other, $R_1$-$R_4$ each independently represent hydrogen or an organic group, and they may be the same or different from each other, and the symbol $n^1$ represents an integer of 1 or greater.

2. An organic insulating material according to claim 1, wherein the polymerizable unsaturated bond is a carbon-carbon triple bond.

3. An organic insulating material according to claim 1, wherein at least one of the polymerizable unsaturated bond-containing groups is a group represented by formula (3) or a group represented by formula (4):

(3)

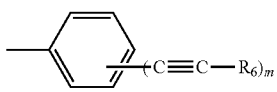
(4)

wherein $R_5$ and $R_6$ each independently represent hydrogen or an organic group, and the symbol m is an integer of 1-5.

4. A varnish for resin film comprising an organic insulating material according to claim 1, and an organic solvent.

5. A resin film obtained by using an organic insulating material according to claim 1, for crosslinking reaction by heating, active energy beam irradiation, or heating and active energy beam irradiation.

6. A semiconductor device provided with a resin film according to claim 5.

* * * * *